United States Patent
Anderson et al.

(10) Patent No.: US 7,679,171 B2
(45) Date of Patent: *Mar. 16, 2010

(54) SENSOR ISOLATION SYSTEM (75) Inventors: Richard S. Anderson, Seabrook, NH (US); David S. Hanson, W. Newbury, MA (US); Frederick J. Kasparian, W. Roxbury, MA (US); Thomas F. Marinis, Haverhill, MA (US); Joseph W. Soucy, Winchester, MA (US)

(73) Assignee: The Charles Stark Draper Laboratories, Inc., Cambridge, MA (US)

( * ) Notice: Subject to any disclaimer, the term of this patent is extended or adjusted under 35 U.S.C. 154(b) by 227 days.

This patent is subject to a terminal disclaimer.

(21) Appl. No.: 11/157,879

(22) Filed: Jun. 21, 2005

(65) Prior Publication Data
US 2005/0258525 A1 Nov. 24, 2005

Related U.S. Application Data (63) Continuation of application No. 10/141,993, filed on May 9, 2002, now Pat. No. 6,937,479.

(60) Provisional application No. 60/313,931, filed on Aug. 21, 2001.

(51) Int. Cl.
*H01L 23/28* (2006.01)

(52) U.S. Cl. .............. 257/678; 439/330; 257/E21.502
(58) Field of Classification Search ................. 257/666, 257/678, 688, E21.502; 324/755; 439/68, 439/330
See application file for complete search history.

(56) References Cited

U.S. PATENT DOCUMENTS

| | | | |
|---|---|---|---|
| 5,364,286 A * | 11/1994 | Matsuoka | 439/330 |
| 5,474,458 A | 12/1995 | Vafi et al. | |
| 6,224,396 B1 * | 5/2001 | Chan et al. | 439/71 |
| 6,262,581 B1 * | 7/2001 | Han | 324/755 |
| 6,289,732 B1 | 9/2001 | Murari et al. | |
| 6,313,529 B1 | 11/2001 | Yoshihara et al. | |
| 6,369,595 B1 * | 4/2002 | Farnworth et al. | 324/755 |
| 6,392,144 B1 | 5/2002 | Filter et al. | |
| 6,660,942 B2 | 12/2003 | Horiuchi et al. | |
| 6,713,828 B1 | 3/2004 | Chavan et al. | |
| 2003/0011903 A1 * | 1/2003 | Ning | 359/823 |
| 2003/0038415 A1 | 2/2003 | Anderson et al. | |
| 2004/0232447 A1 * | 11/2004 | Crane et al. | 257/202 |
| 2006/0081583 A1 * | 4/2006 | Hembree et al. | 219/209 |

* cited by examiner

*Primary Examiner*—Nathan W Ha
(74) *Attorney, Agent, or Firm*—Iandiorio Teska & Coleman (57) ABSTRACT

A sensor isolation system including a sensor, a package for the sensor, and a compliant interposer disposed between the sensor and the package and interconnecting the sensor to the package to isolate the sensor from thermal and mechanical stresses and yet at the same time providing a physical interconnect between the sensor and the package.

19 Claims, 12 Drawing Sheets

SENSOR ISOLATION SYSTEM

RELATED APPLICATIONS

This application is a continuation of U.S. patent application Ser. No. 10/141,993, filed on May 9, 2002 now U.S. Pat. No. 6,937,479, entitled "SENSOR ISOLATION SYSTEM", which claims benefit of and priority to U.S. Provisional Application No. 60/313,931, filed on Aug. 21, 2001, entitled, "STRESS ISOLATING INTERPOSER FOR MOUNTING MICROMECHANICAL SENSOR DIE WITHIN CERAMIC PACKAGES", both of which are incorporated by reference herein.

FIELD OF THE INVENTION

This invention relates to a sensor isolation system and also to a compliant interposer which insulates a sensor from thermal and mechanical stresses while providing a physical interconnection between the sensor and the package.

BACKGROUND OF THE INVENTION

Micro-electro-mechanical (MEM) dies, such as gyroscopes and accelerometers are typically very small and sensitive to thermal and mechanical stresses. In the prior art, the sensor die is rigidly mounted to the floor or substrate of a ceramic chip carrier package to maintain axis alignment, bias stability, and scale factor stability with respect to the package over time and temperature variations. The mounting scheme used strives to maintain rigidity and stability over a wide range of environmental conditions, such as temperature cycling, vibrational stresses, and g-loading. At the same time, the package should not impart any significant stresses on the sensor over these same environmental conditions. Furthermore, any minor stresses that do occur should be stable and cannot exhibit any hysteresis effects which would affect performance of the sensor.

As stated above, the MEM die, such as a gyroscope or accelerometer sensor, is typically directly bonded to the package, or chip carrier. Aluminum oxide is often used as the material for a fabricating a hermetic chip carrier for such MEM devices. In some cases, a small mounting pad may be placed between the floor of the chip carrier and the sensor in an attempt to absorb various stresses and strains which occur during the operation of the device. Another prior art technique to reduce thermal stress on the sensor is to braze the sensor directly to a package made of a material more closely matching the thermal expansion coefficient of the sensor, such as aluminum nitride.

These prior art techniques exhibit several distinct disadvantages. When the sensor is directly bonded to the package, a large thermal stress develops because the thermal expansion coefficient of the package often greatly exceeds the thermal expansion coefficient of the sensor. Furthermore, the braze materials may impart similar thermal stress as stated above. The result is warping of the sensor which adversely affects its performance. This prior art technique also makes the sensor susceptible to any externally applied forces.

Prior art techniques which attempt to reduce thermal and mechanical stresses by utilizing a small pad near the center of the sensor require precise control of the quantity of solder used, as well as precise control of the placement of the die. Using this prior art technique, localized attachment is susceptible to alignment shifts due to stress relaxation of the brazed connection.

If expensive aluminum nitride is used as the package material because this material has a thermal expansion coefficient which more closely matches the thermal coefficient of the sensor, the result is a package which can cost as much as eight times more than an aluminum oxide package.

Additionally, brazing the die to the floor of the package still leaves it susceptible to strains and stresses due to the flexing of the package or chip carrier floor. Finally, the prior art techniques do not always adequately control thermal stresses, are not easily scalable to large size dies, are not mechanically robust, and can be expensive to implement because they require specialized materials and/or assembly methods.

SUMMARY OF THE INVENTION

It is therefore an object of this invention to provide a sensor isolation system.

It is a further object of this invention to provide such a sensor isolation system which reduces the thermal and mechanical stresses between a sensor and its package.

It is a further object of this invention to provide such a sensor isolation system which advantageously isolates the sensor from the package.

It is a further object of this invention to provide such a sensor isolation system which eliminates the problems associated with attaching the sensor directly to the package.

It is a further object of this invention to provide such a sensor isolation system which reduces warping of a sensor.

It is a further object of this invention to provide such a sensor isolation system which maintains axis alignment, bias stability, and scale factor of a sensor mounted to a package.

It is a further object of this invention to provide such a sensor isolation system which is inexpensive and easy to fabricate.

It is a further object of this invention to provide such a sensor isolation system which is scalable for large sensors.

This invention results from the realization that a robust sensor isolation system can be achieved, not by directly bonding the sensor or die directly to the chip carrier or by using a pad to isolate the sensor from the package, but, instead, by a unique compliant interposer disposed between the sensor and the package which interconnects the sensor to the package and isolates the sensor from thermal and mechanical stresses, and yet, at the same time, provides a physical interconnection between the sensor and the package.

This invention features a sensor isolation system including a sensor, a package for the sensor, and a compliant interposer disposed between the sensor and the package and interconnecting the sensor to the package to isolate the sensor from thermal and mechanical stresses and yet at the same time providing a physical interconnect between the sensor and the package. The sensor may be a die configured as an accelerometer or a gyroscope. In one example, the package is a chip carrier and includes a floor and walls upstanding from the floor. One interposer interconnects the sensor with the walls of the chip carrier cradling the sensor above the floor of the chip carrier. Another interposer is disposed on the floor of the chip carrier and supports the sensor above the floor of the chip carrier.

The interposer may include a peripheral base portion with inwardly directed spring elements. The sensor is disposed on the inwardly directed spring elements and the peripheral base portion is attached to the floor of the chip carrier. Another interposer includes a central base portion with outwardly extending spring elements. The sensor is disposed on the central base portion and the outwardly extending spring elements are attached to the floor of the chip carrier.

A typical die package includes a substrate and the compliant interposers may be disposed between the sensor and the substrate. If the package includes a floor and walls upstanding from the floor, one interposer includes spring members which typically extend between a wall and the sensor. In one example, the walls of the package may each include a shelf, the sensor is a die, and each spring member includes a seat for the die and an arm extending from the seat terminating in a tab residing on the shelf. Another compliant interposer includes a continuous member disposed adjacent selected walls of the package. The continuous member includes spaced seats for supporting the die above the floor and spaced arms each having tabs residing on the shelves of the package. The seats may be oriented parallel to the tabs or may be angled. The continuous member may be U-shaped having a base portion and two spaced legs extending from the base portion, the base portion including at least one seat and one tab, each spaced leg also including at least one seat and one tab. The seats are typically offset from the tabs and the seats on the two legs are diametrically opposed as are the tabs on the two legs.

In other designs, the compliant interposer is a portion of or even integral with a portion of the package. In one such embodiment, the compliant interposer includes a central base portion with outwardly extending spring elements, the sensor is disposed on the central base portion, and the outwardly extending spring elements are attached to or from an integral portion of the package. The outwardly extending spring elements are typically integral with the central base portion and lie in the same plane as the central base portion. Each outwardly extending spring element may include a tab portion connected to the central base portion and a pair of arms extending from the tab. Ideally, the arms extend transversely from the tab portion in opposite directions and extend along the periphery of the central base portion and include a continuous channel through the arms and the tab portion.

Each compliant interposer may include a vibration damping structure, such as a coating. The interposers may also include a heater, such as a resistance heater. In one example, the interposer includes a planar base portion and spring elements extending therefrom. The heater, disposed on the planar base portion, is a pattern of conductive lands. The spring elements may extend inwardly from the planar base portion, or alternatively, the spring elements extend outwardly from the planar base portion. Such an interposer may further or instead include a measurement subsystem, such as a temperature sensor in the form of a pattern of conductive lands disposed on the interposer. The material of the lands changes in resistance as a known function of temperature. If the interposer includes a planar base portion and spring elements extending therefrom, the measurement subsystem may be disposed on the planar base portion. The spring elements may extend inwardly from the planar base portion, or alternatively may extend outwardly from the planar base portion.

The preferred interposer is made of a material which has a coefficient of thermal expansion approximately the same as the coefficient of thermal expansion of the die. Ideally, the die is made of silicon or glass and the interposer is made of silicon. In another example, the interposer is made of metal.

One interposer for isolating a sensor from its package features a continuous member, spaced seats extending from the continuous member for supporting the sensor, and spaced legs extending from the continuous member terminating in tabs which attach the continuous member to the package. Ideally, the seats are parallel to the tabs or may be angled. In one example, the continuous member is U-shaped having a base portion and two spaced legs extending from the base portion, the base portion including at least one seat and one tab, each spaced leg also including at least one seat and one tab. The seats are offset from the tabs and the seats on the legs are diametrically opposed.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1A:
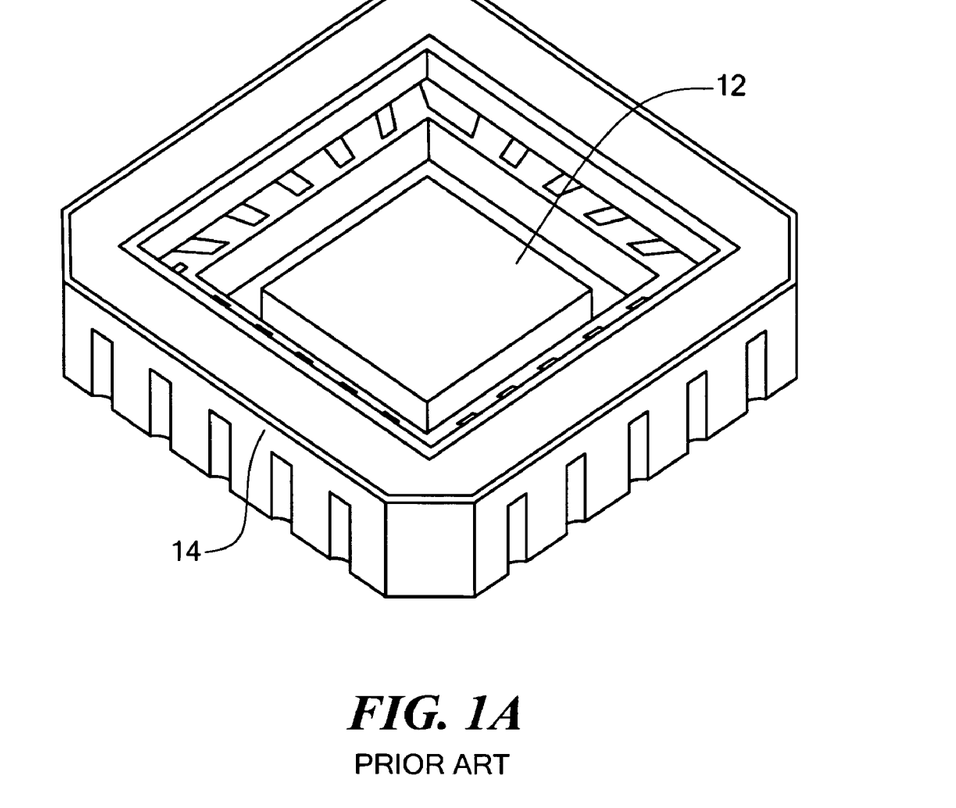
FIG. 1A is an isometric view of a die mounted directly to the floor of a chip carrier in accordance with the prior art.
Figure 1B:
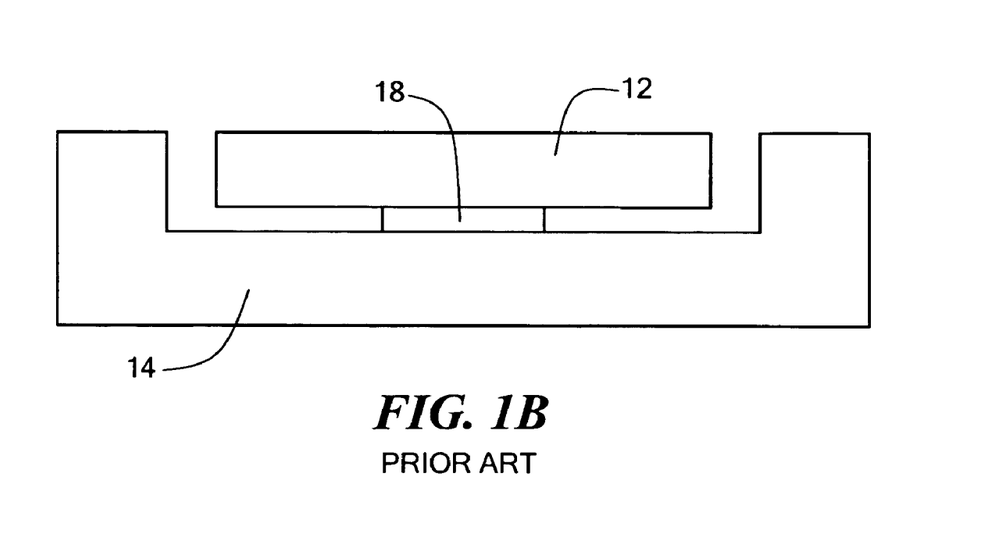
FIG. 1B is a cross-sectional view of another prior art die/chip carrier system.

As explained in the Background Section above, sensor 12, FIG. 1 is shown mounted directly to package 14 in accordance with the prior art. Sensor 12 may be a micro-electro-mechanical (MEM) gyroscope/accelerometer or other type of sensor. In the prior art, sensor 12 is rigidly mounted to the floor or substrate of package 14 as shown. Hermetic package 14 is typically made of aluminum oxide. Another prior art technique, as also delineated in the Background Section above, employs small pad 18, FIG. 1B which is placed near the center of package 14 in an attempt to isolate sensor 12 from thermal and mechanical stresses and strains.

However, these prior art systems exhibit several distinct disadvantages. First, the thermal expansion of package 14, typically made of aluminum oxide, is significantly greater than the thermal expansion of sensor 12. Consequently, when sensor 12 is directly bonded to package 14, large thermal stresses develop which cause sensor 12 to warp which adversely affects its performance. Further, direct attachment of sensor 12 to package 14 makes sensor 12 susceptible to any externally applied forces. Moreover, when small pad 18, FIG. 1B is employed at the center of package 14, precise control of the amount of the solder used as well as precise control of placement of sensor 12 is required. Localized attachment is also susceptible to alignment shifts due to overstressing the brazed connection. Also in the prior art, package 14 was made of a material which more closely matches the thermal expansion coefficient of the sensor, such as aluminum nitride. However a package fabricated from aluminum nitride is eight times more expensive than aluminum oxide.

In contrast, the sensor isolation system of the subject invention typically includes a sensor, a package, and, in addition, a compliant interposer disposed between the sensor and the package. The unique designs of the compliant interposers disclosed herein isolate the sensor from thermal and mechanical stresses, and yet, at the same time, provide a mechanically stable physical interconnection between the sensor and the package. The compliant interposer may take several forms including a U-shaped continuous member interposer with spaced legs which cradle and support the sensor above the floor of the chip carrier (FIGS. 2-4C), a planar interposer with a peripheral base portion attached to the floor of the chip carrier and inwardly directed spring elements on which the sensor is disposed (FIGS. 5-6), another planar interposer with a central base portion and outwardly directed spring elements (FIGS. 7-11), and, also, an interposer including a plurality of discrete spring members which interconnect and support the sensor above the floor of the chip carrier (FIGS. 12A-12B). Other equivalent embodiments may occur to those skilled in the art.

Figure 2:
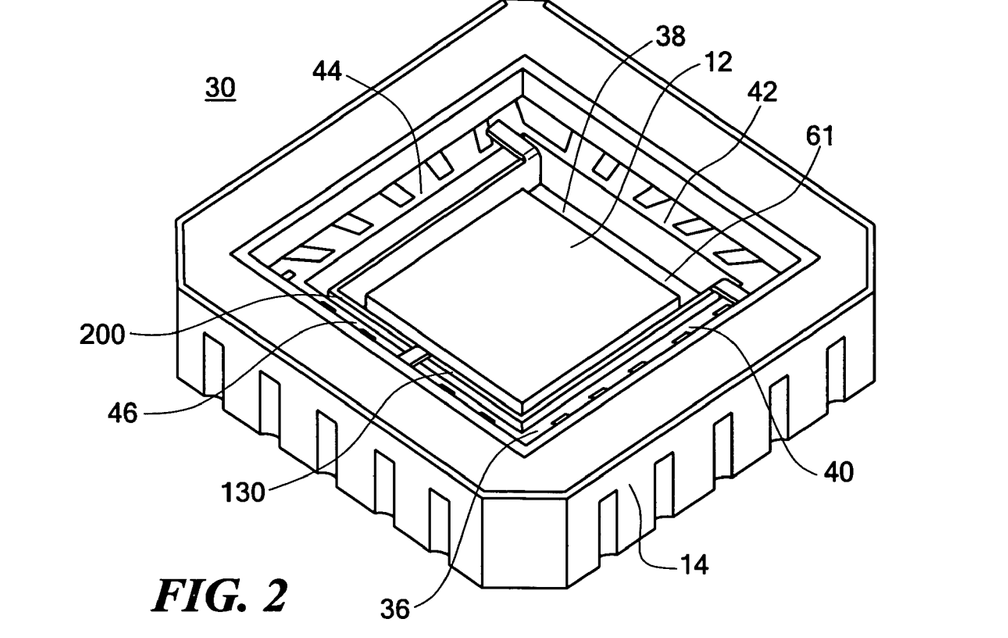
FIG. 2 is a schematic three-dimensional top view of one embodiment of the sensor isolation system of the subject invention showing a compliant interposer in place in a chip carrier and having a die mounted thereon.

U-shaped compliant interposer 36, FIG. 2 cradles and supports sensor 12 above the floor or substrate of chip carrier 14 or any other device package. Complete system 30 thus includes sensor 12, package 14, and compliant interposer 36 disposed between sensor 12 and package 14. Interposer 36 serves to isolate sensor 12 from thermal and mechanical stresses while at the same time provides a physical interconnection between sensor 12 and package 14. Preferably, sensor 12 is a die and may be configured as an accelerometer, a gyroscope, or other sensor. Package 14 is typically a chip carrier including floor 38 and walls 40, 42, 44, and 46 upstanding from floor 38. Interposer 36 is designed to interconnect sensor 12 with walls 40-46 of chip carrier 14 and cradles sensor 12 above floor 38 of chip carrier 14. Preferably, package 14 includes substrate 61 with compliant interposer 36 disposed between sensor 12 and substrate 61.

Figure 3A:
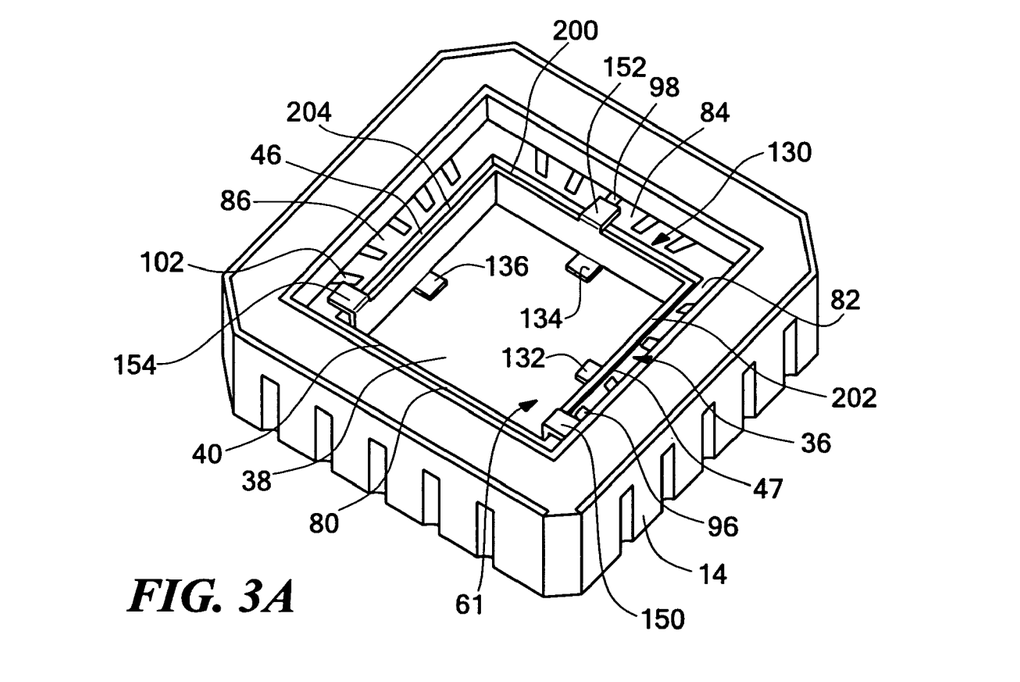
FIG. 3A is a schematic three-dimensional top view of the sensor isolation system shown in FIG. 2 without the die mounted on the compliant interposer.
Figure 3B:
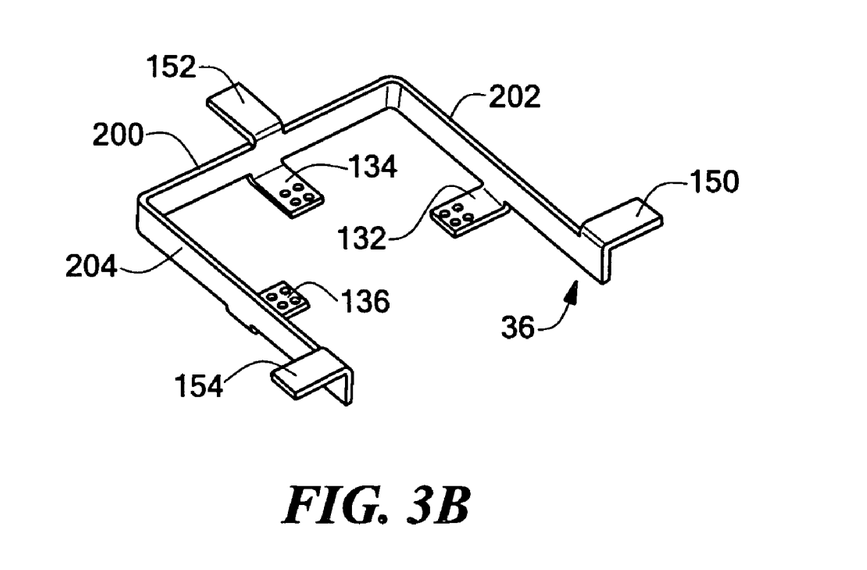
FIG. 3B is a schematic three-dimensional top view of the compliant interposer shown in FIG. 3A.
Figure 4A:
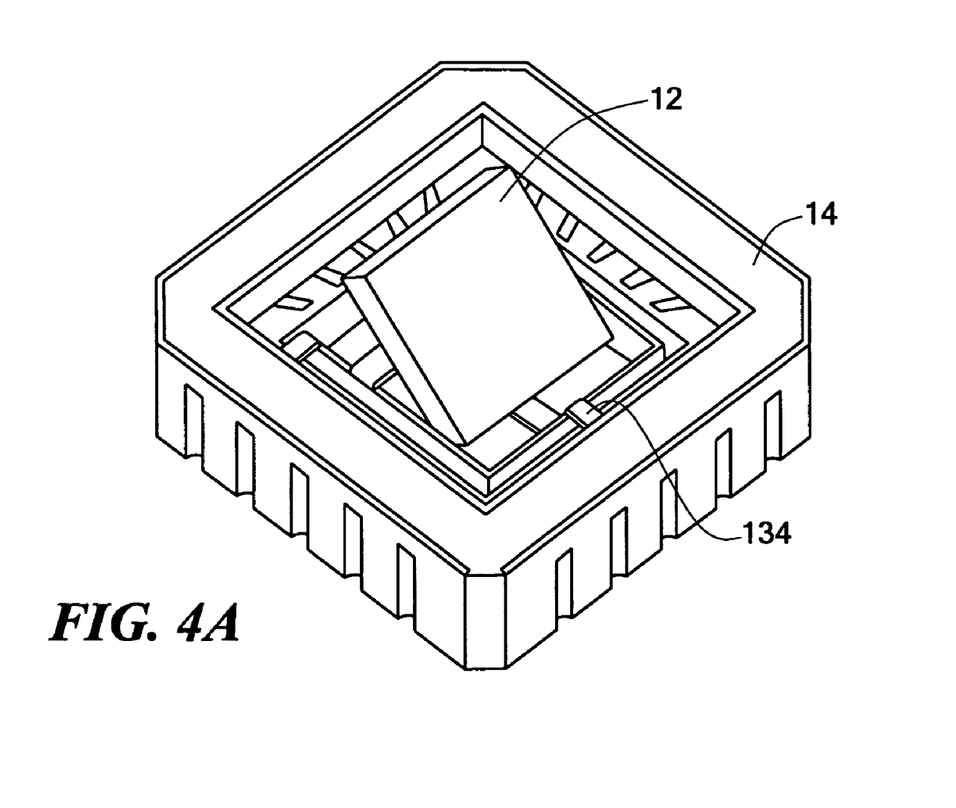
FIG. 4A is a schematic three-dimensional top view of another embodiment of the sensor isolation system of the subject invention showing a compliant interposer in place in a chip carrier and having a die mounted thereon.
Figure 4B:
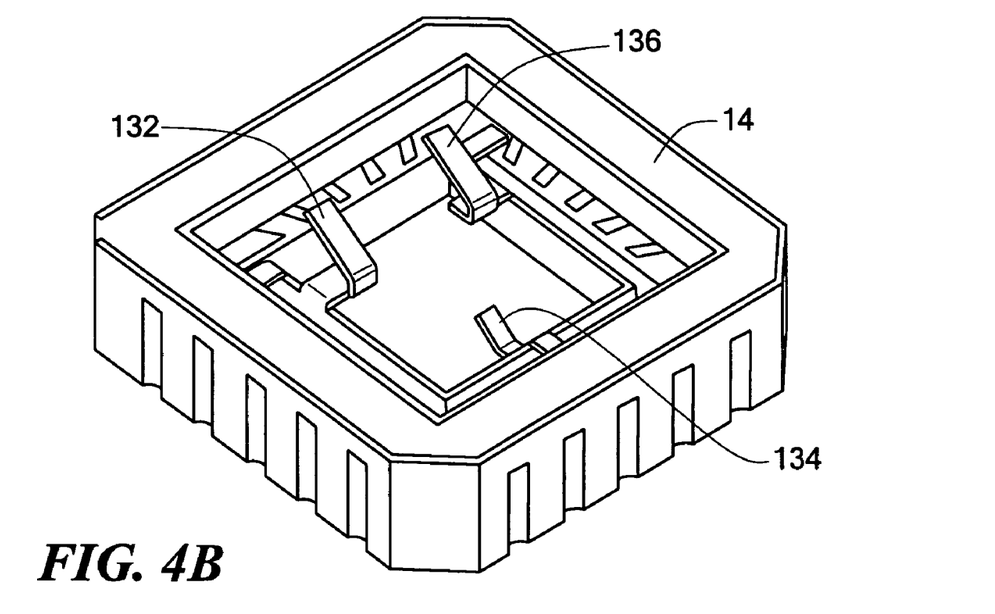
FIG. 4B is a schematic three-dimensional top view of the sensor isolation system shown in FIG. 4A without the die mounted on the compliant interposer.
Figure 4C:
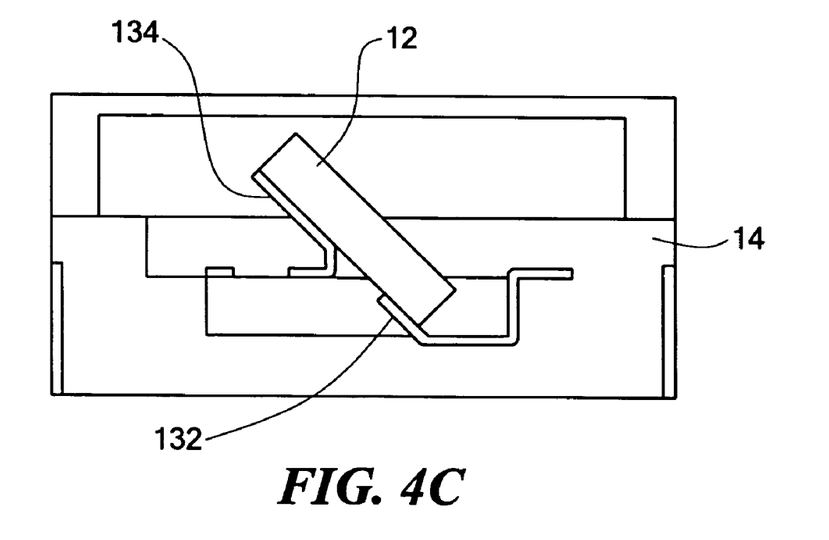
FIG. 4C is a schematic side-view of the sensor isolation system shown in FIG. 4A.

As shown in FIGS. 3A and 3B, compliant interposer 36 includes continuous member 130 interconnecting and supporting a sensor (not shown) with respect to package 14. Spaced legs 202 and 204 extend from base portion 200. Base portion 200 includes at least one seat 134 and one tab 152 and each spaced leg 202 and 204 also includes at least one seat 132 and 136, respectively, and one tab 150, and 154, respectively. In FIGS. 2-3B, seats 132, 134, and 136 are disposed parallel to tabs 150, 152, and 154. Seats 132, 134, and 140 may, however, be angled as shown in FIGS. 4A-4C to support sensor 12 in an angled configuration. As shown in FIGS. 3A and 3B, seats 132, 134 and 136 may be offset from tabs 150, 152, and 154, respectively, and seats 132 and 136 are diametrically opposed as are tabs 150 and 154. Typically, tabs 150, 152, 154 rest on shelves 82, 84, and 86, respectively, of package 14 and attached thereto by gold solder bumps on the back of the tabs which mate with conductive elements on the shelves. Alternatively, bulk solder may be used. Interposer 36 is typically fairly compliant: 3-5 mils thick and made of metal. Compliant interposer 36 may also include a vibration dampening structure, such as a coating applied to interposer 36. The coating is typically 3-5 mils thick and made of viscoelastic material. The coating provides additional absorption of vibrational energy and thermal stresses induced on sensor 12 and package 14. There may also be vibration damping material disposed between interposer 36 and the walls package 12.

Figure 5:
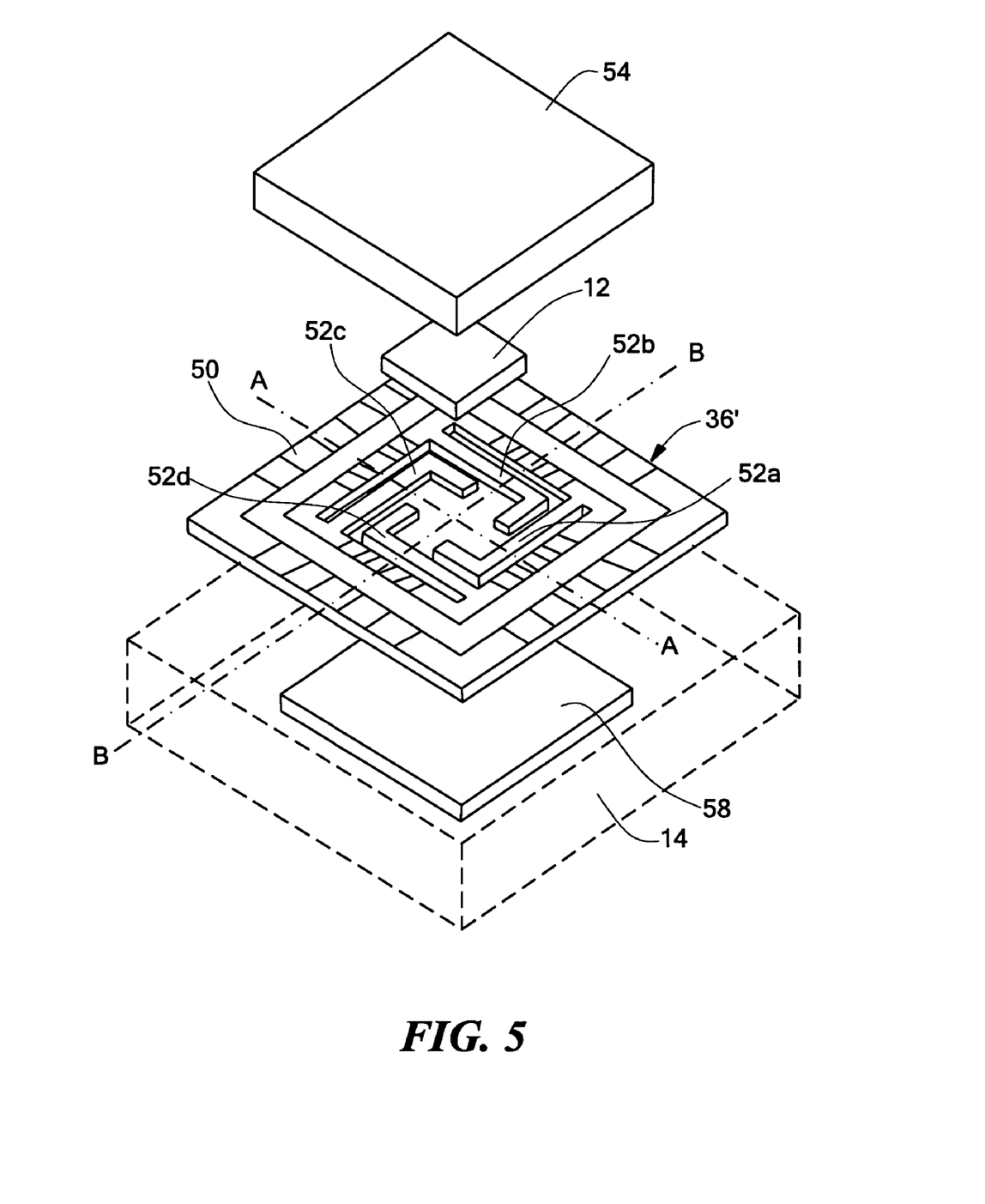
FIG. 5 is an exploded view of another embodiment of a sensor isolation system in accordance with the subject invention.
Figure 6:
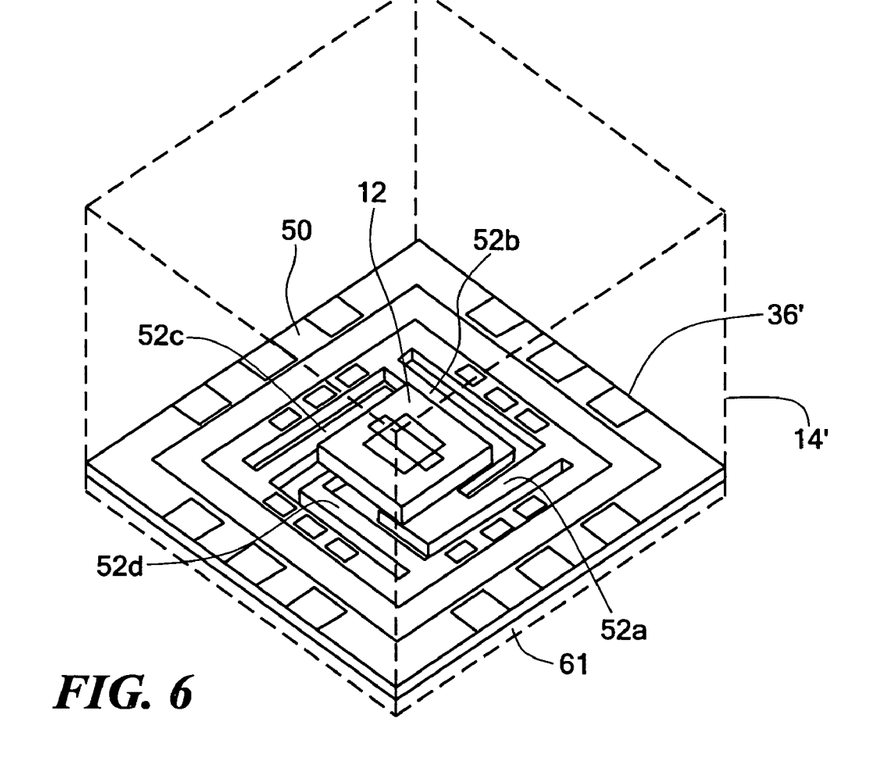
FIG. 6 is a schematic view of another sensor isolation system utilizing the interposer shown in FIG. 5.
Figure 7:
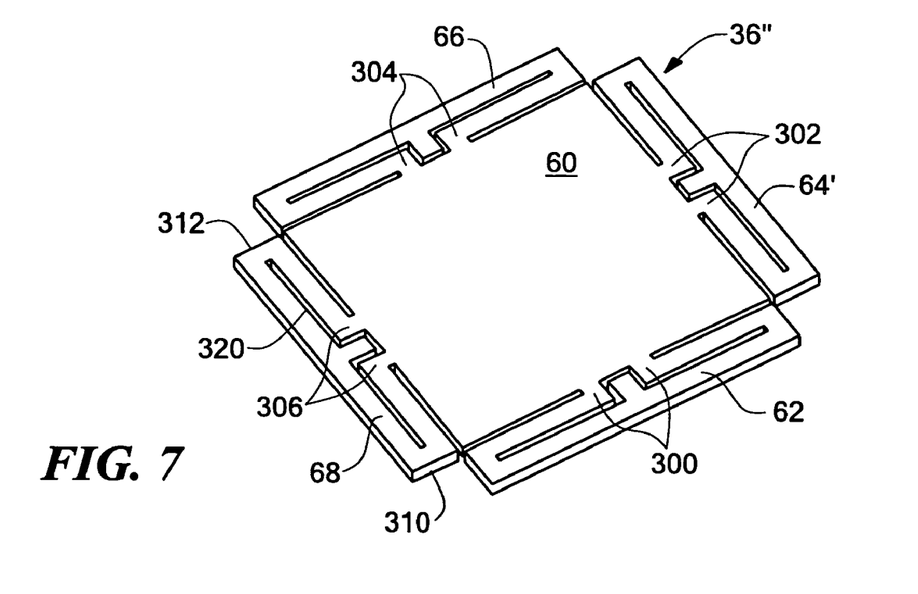
FIG. 7 is a schematic three-dimensional top view showing another embodiment of a compliant interposer in accordance with the subject invention.

Planar interposer 36' shown in FIGS. 5 and 6 includes a peripheral base portion 50 located on the floor of the chip carrier and inwardly directed spring elements 52a, 52b, 52c, 52d on which the sensor is disposed. The inwardly directed spring elements absorb thermal and mechanical stresses. At the same time, peripheral base portion 50 provides an interconnection between the sensor and the package. Peripheral base portion 50 may be directly attached to floor 58 of package 14. Ideally, cover 54 seals sensor 12 with respect to interposer 36' and floor 58 of package 14.

In one example, inwardly directed spring elements 52a and 52c, FIG. 5 extend in the direction of a first axis A-A then turn to extend in the direction of axis B-B. Inwardly directed spring elements 52b and 52d, in contrast, extend in the direction of axis B-B and then turn and extend in the direction of axis A-A. Ideally, axis A-A and axis B-B are orthogonal. Typically, inwardly directed spring elements 52a-52d lie in the same plane as and are integral with peripheral base portion 50. In another example, interposer 36' is itself an integral portion (e.g., the floor) of package 14', as shown in FIG. 6.

Interposer 36", FIGS. 7-11 includes central base portion 60 and typically integral outwardly directed spring elements 62, 64, 66, and 68 secured to the floor of a chip carrier. The sensor is then disposed on central base portion 60. Outwardly extending spring elements 62-68 absorb thermal and mechanical stresses while at the same time provide an interconnection between the sensor and the package. Outwardly extending spring elements 62, 64, 66, and 68, FIG. 7 may define tab portions 300, 302, 304, and 306, respectively, connected to central base portion 60. Ideally, a pair of arms extends from each tab portion 300-306. For example, arms 310 and 312 extend transversely from tab portion 306 in opposite directions. Arms 310 and 312 may extend along the periphery of central base portion 60 and may include continuous channel 320 which extends through arms 310 and 312 of tab portion 306.

Figure 8:
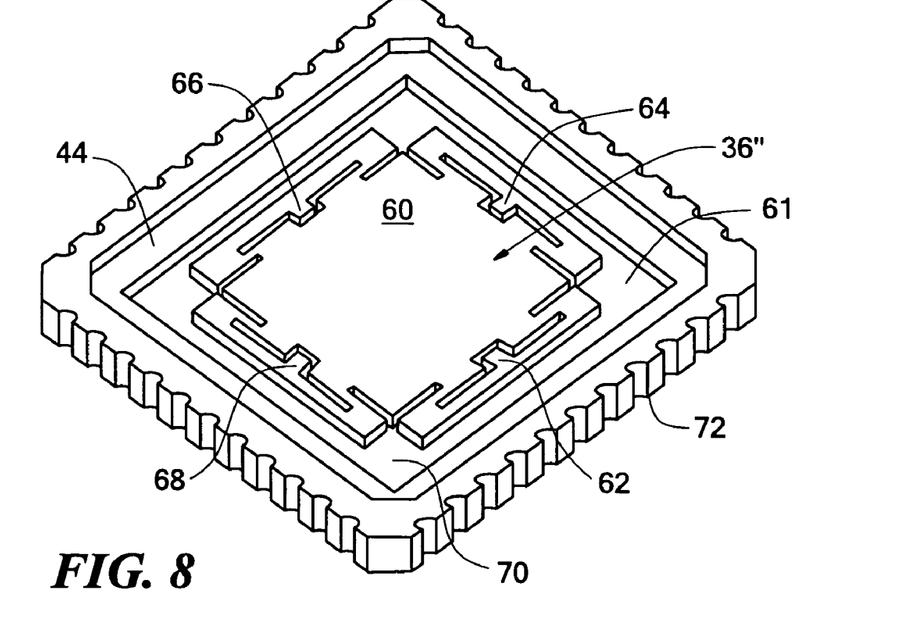
FIG. 8 is a schematic three-dimensional top view of the compliant interposer shown in FIG. 7 in place in a chip carrier.
Figure 9:
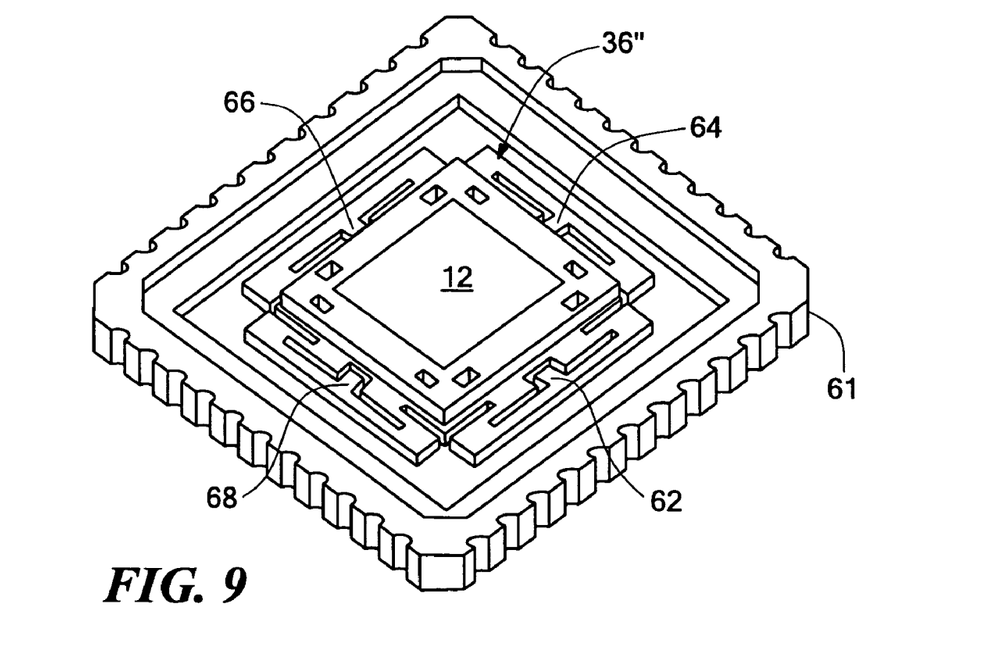
FIG. 9 is another schematic three-dimensional top view of the compliant interposer shown in FIG. 7 disposed in a chip carrier and having a die mounted thereon.
Figure 10:
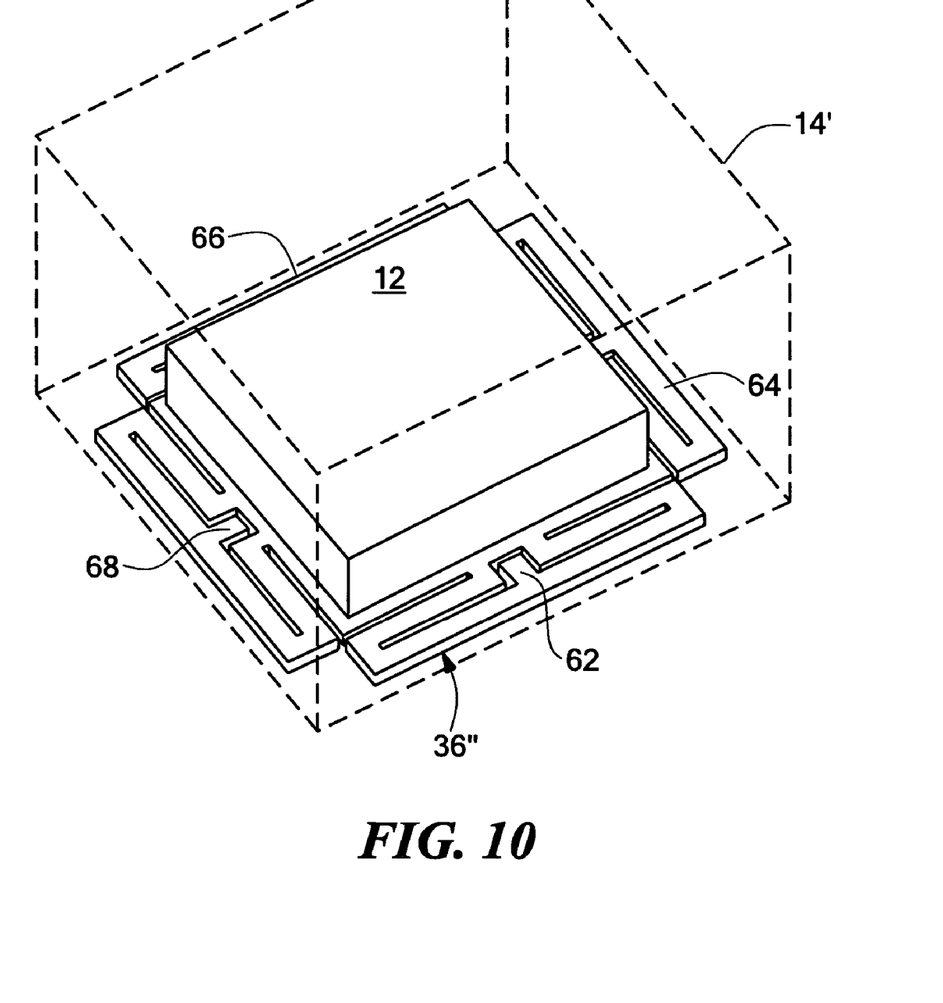
FIG. 10 is a schematic three-dimensional top view of another embodiment of a sensor isolation system in accordance with the subject invention utilizing the interposer shown in FIG. 7.

Sensor 12, FIG. 9 is shown disposed on central base portion 60 and outwardly extending spring elements 62-68 may be directly attached to floor 70 of chip carrier 72 as shown in FIG. 8. In another embodiment, interposer 36" is an integral portion of package 14' as shown in FIG. 10.

Figure 11:
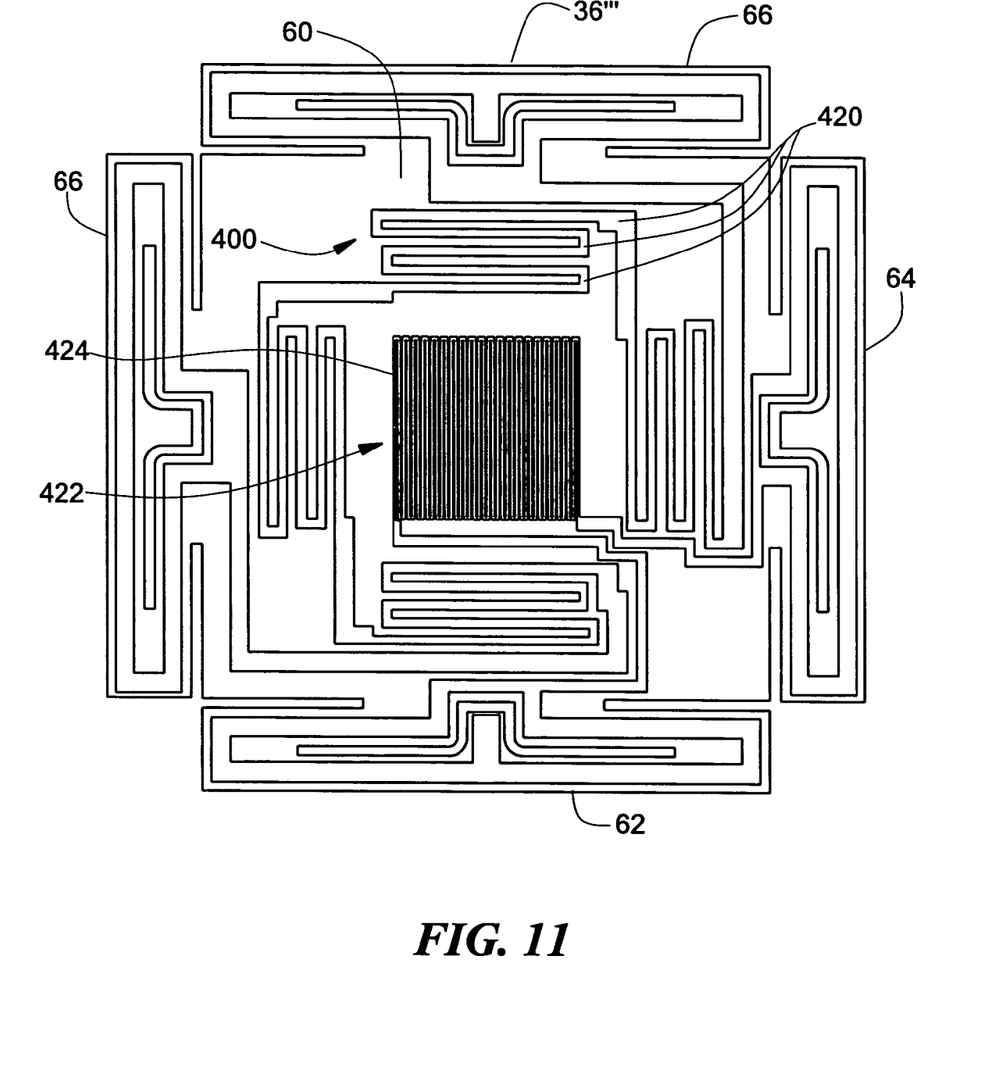
FIG. 11 is a plan view of the compliant interposer shown in FIG. 7 with integral heater and thermal control sensor which could be used to maintain a MEMs sensor at constant temperature with minimal power to minimize the thermal stain effects on the sensor.
Figure 12A:
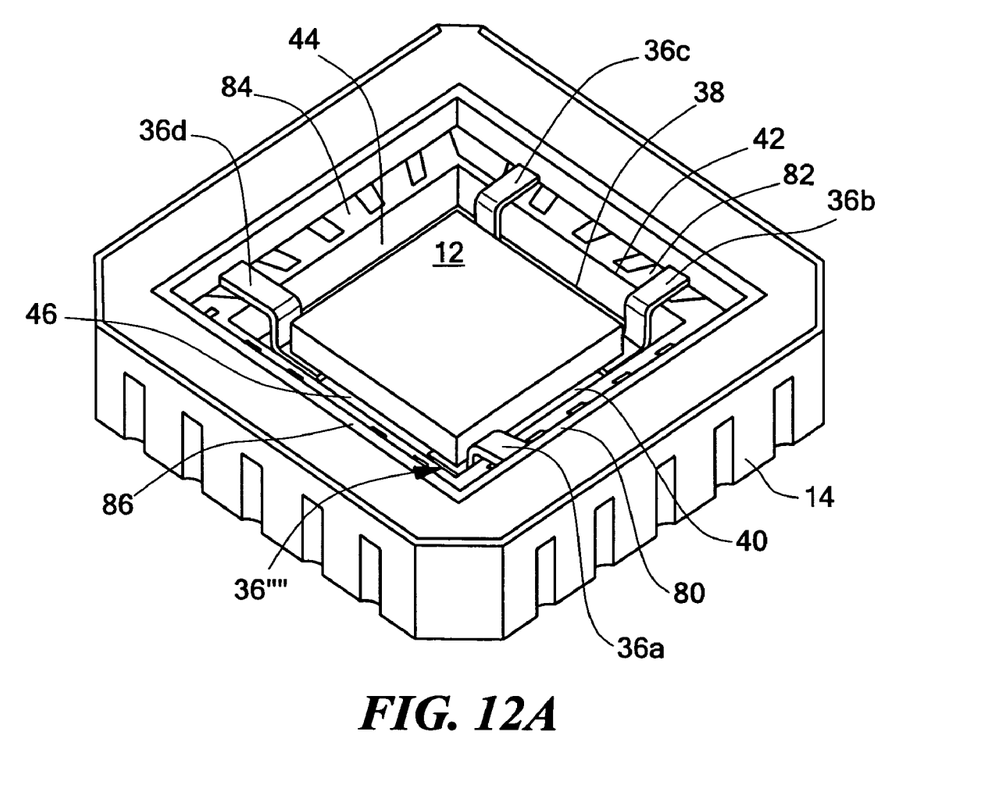
FIG. 12A is a schematic three-dimensional top view of still another embodiment of the sensor isolation system of the subject invention showing another example of a compliant interposer.
Figure 12B:
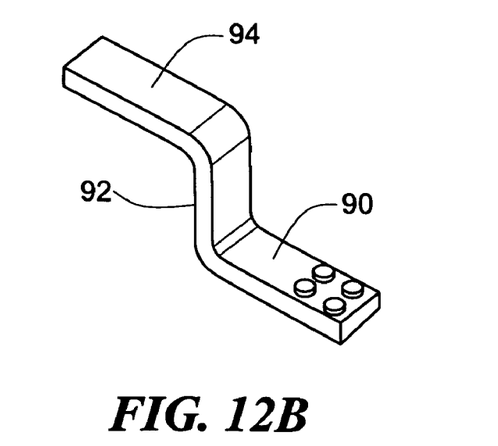
FIG. 12B is an enlarged schematic side view of a single spring member of the interposer shown in FIG. 12A.

Compliant interposer 36''' may include heater 400, FIG. 11, typically a resistance heater. In one example, heater 400 is disposed on planar base portion 60 and is a pattern of conductive lands 420 disposed on planar base portion 60. Interposer 36''' also includes measurement subsystem 422 such as a temperature control sensor. Ideally, temperature control sensor 422 also includes a pattern of conductive lands made of a material which changes in resistance as a known function of temperature. Typically, measurement subsystem 422 is also disposed on planar base portion 60. Heater 400 and/or measurement subsystem 422 may also be included as components of interposer 36', FIGS. 5-6.

In still another example, the sensor isolation system of the subject invention includes compliant interposer $36^{IV}$, FIGS. 12A-12B made of plurality of spring members which cradle and support the sensor above the floor of the chip carrier while at the same time interconnect the sensor to the package. Discrete spring members 36a, 36b, 36c, and 36d interconnect and support sensor 12 with respect to package 14. As shown, package 14 includes floor 38 and walls 40, 42, 44, and 46 upstanding from floor 38 and with each spring member 36a, 36b, 36c, and 36d extends between walls 40, 42, 44, and 46 and sensor 12, respectively. Walls 40, 42, 44, and 46 include shelves 80, 82, 84, and 86, respectively, and each spring member 36a-36d includes seat 90, FIG. 12B, for die 12, FIG. 12A and arm 92 terminating in a tab 94 which rests on one of shelves 80-86, FIG. 12A.

In accordance with the subject invention, the material of each interposer ideally has a coefficient of thermal expansion which matches or approximately matches the coefficient of the material of die 12, FIG. 12. In one example, the die is made of silicon or glass and the interposers are made of silicon. However, the interposers can also be made of metal or other materials.

A complete system in accordance with this invention thus includes a sensor, a package for the sensor, and means, disposed between the sensor and the package, for interconnecting the sensor to the package to isolate the sensor from thermal and mechanical stresses and yet at the same time for providing a physical interconnection between the sensor and the package. The means for interconnecting and isolating the sensor from the package includes, but is not limited to, compliant interposers 36, 36', 36", 36''' and $36^{IV}$ described with respect to FIGS. 2-12A.

Figure 13:
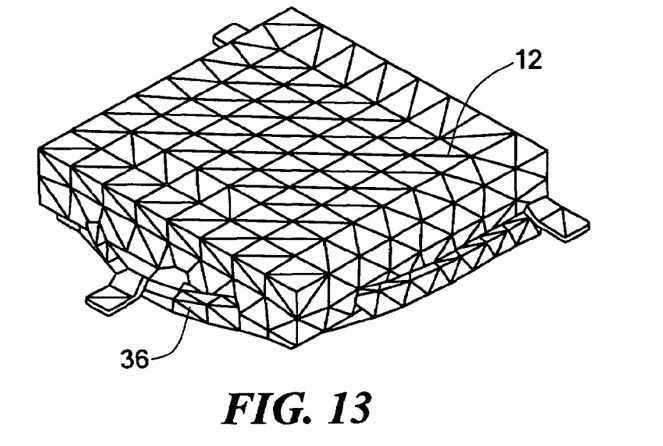
FIG. 13 is a printout from a computer simulation showing the deflection of the compliant interposer of FIG. 2.

FIG. 13 shows interposer 36, FIG. 2 being deflected due to a large change in temperature. As can be seen from FIG. 13, when a large thermal stress is applied to the sensor 12, the interposer absorbs the thermal stress by elastically deforming. The result is a dramatic reduction in the thermal and mechanical stresses on the sensor.

Figure 14:
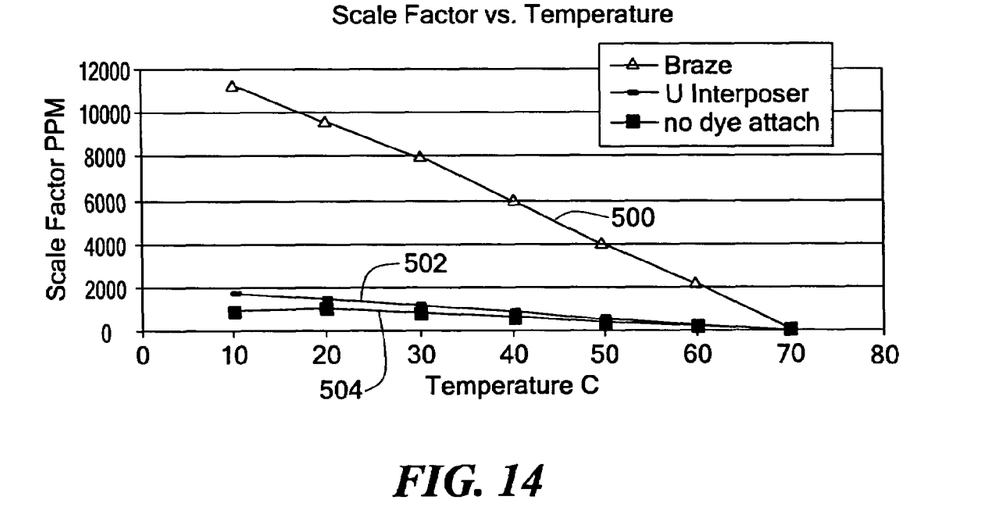
FIG. 14 is a graph showing the scale factor versus temperature of a prior art sensor die/carrier system compared to the sensor isolation system shown in FIG. 2.

A graph of scale factor versus temperature, FIG. 14, shows a comparison of: a) a prior art system in which the sensor is directly brazed to the package, b) interposer 36, FIG. 2, and c) an example in which the sensor is not attached at all to the package, when exposed to a temperature cycle ranging from 10° C. to 70° C. As indicated by line 500, when the sensor is directly attached to the package, there is a significant scale factor ranging from 0 to about 12,000 over the temperate cycle. In sharp contrast, the sensor isolation system of the subject invention shows a very small scale factor, as indicated by line 502, ranging from 0 to about 2000 over the temperate cycle, almost equal to that of no sensor attachment scheme at all as indicated by line 504.

Figure 15:
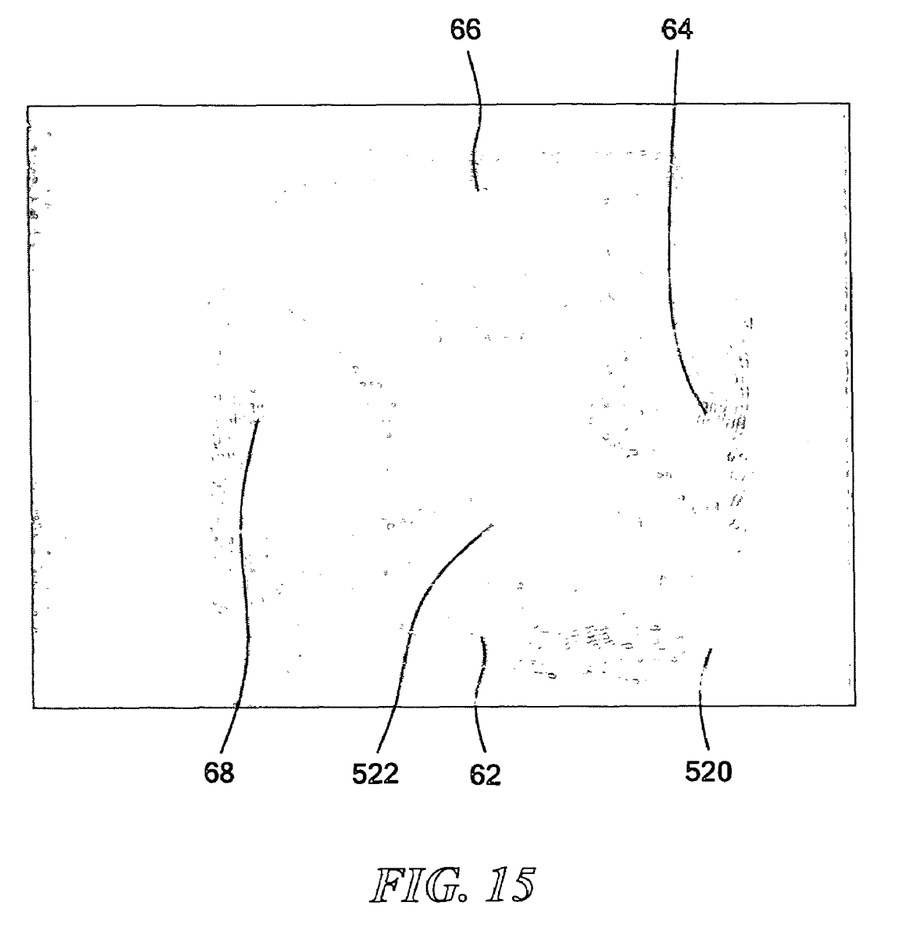
FIG. 15 is an interferometric measurement showing how the sensor isolation system shown in FIG. 7 absorbs thermal and mechanical stresses.

An interferometric measurement for the interposer of FIGS. 7-10 revealed that spring elements 62, 64, 66, and 68 absorb significant thermal and mechanical stresses as indicated by refraction lines 520, FIG. 15 being tightly spaced together compared to refraction lines 522 which are spaced far apart. The results indicate a significant reduction in the thermal and mechanical stresses on sensor 12.

Thus, the sensor isolation system of the subject invention includes several embodiments of a unique compliant interposer disposed between the sensor and the package (or forming a portion of the package) and which interconnects the sensor to the package while at the same time isolates the sensor from the thermal and mechanical stresses. As shown in the simulations above, the compliant interposers elastically deform to absorb thermal and mechanical stresses. The robust design of the subject invention eliminates warping of the sensor by reducing external mechanical and thermal stresses acting on the sensor while at the same time maintains axis alignment, bias stability, and scale factor. Moreover, all of the interposer embodiments are fairly simple in design, inexpensive to manufacture, and scalable to large die sizes.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims:

What is claimed is:

1. An interposer for isolating a sensor from its package, the interposer comprising:
   a planar base portion; and
   a plurality of spring elements extending from the base portion and disposed between the sensor and the package, the spring elements elastically deforming and isolating the sensor from thermal and mechanical stresses to the package.

2. The interposer of claim 1 in which the planar base portion is the periphery of the interposer and the plurality of spring elements extend inwardly from the base portion for supporting the sensor thereon.

3. The interposer of claim 2 in which the inwardly extending spring elements are integral with the peripheral base portion.

4. The interposer of claim 2 in which each inwardly extending spring element extends first along a first axis and then turns to extend along a second axis.

5. The interposer of claim 4 in which the first and second axis are orthogonal.

6. The interposer of claim 2 in which the inwardly extending spring elements line the same plane as the peripheral base portion.

7. The interposer of claim 1 in which the planar base portion is centrally located to support the sensor thereon and the plurality of spring elements extend outwardly from the centrally located base portion.

8. The interposer of claim 7 in which the outwardly extending spring elements are integral with the central base portion.

9. The interposer of claim 7 in which each outwardly extending spring element includes a tab portion connected to the central base portion and a pair of arms extending from the tab.

10. The interposer of claim 9 in which the arms extend transversely from the tab portion in opposite directions.

11. The interposer of claim 9 further including a channel through the arms and the tab portion.

12. The interposer of claim 11 in which the channel is continuous.

13. The interposer of claim 1 in which the interposer includes a heater.

14. The interposer of claim 13 in which the heater is disposed on the planar base portion.

15. The interposer of claim 14 in which the heater is a pattern of conductive lands disposed on the base portion.

16. The interposer of claim 1 in which the interposer includes a measurement subsystem.

17. The interposer of claim 16 in which the measurement subsystem is a temperature sensor.

18. The interposer of claim 17 in which the temperature sensor includes a pattern of conductive lands disposed on the interposer, the lands made of a material which changes in resistance as a known function of temperature.

19. The interposer of claim 1 further including both a heater and a temperature sensor.

* * * * *

UNITED STATES PATENT AND TRADEMARK OFFICE
CERTIFICATE OF CORRECTION

| | | |
|---|---|---|
| PATENT NO. | : 7,679,171 B2 | Page 1 of 2 |
| APPLICATION NO. | : 11/157879 | |
| DATED | : March 16, 2010 | |
| INVENTOR(S) | : Anderson et al. | |

It is certified that error appears in the above-identified patent and that said Letters Patent is hereby corrected as shown below:

Replace Figure 15 on sheet 12/12 with the attached Replacement Sheet 12/12.

Signed and Sealed this
Eighteenth Day of October, 2011

David J. Kappos
*Director of the United States Patent and Trademark Office*

*FIG. 15*